(12) United States Patent
Ha et al.

(10) Patent No.: US 9,819,364 B2
(45) Date of Patent: Nov. 14, 2017

(54) APPARATUS AND METHOD FOR TRANSMITTING/RECEIVING SIGNAL IN COMMUNICATION SYSTEM SUPPORTING BIT-INTERLEAVED CODED MODULATION WITH ITERATIVE DECODING SCHEME

(71) Applicants: Samsung Electronics Co., Ltd., Suwon-si (KR); KOREA ADVANCED INSTITUTE OF SCIENCE AND TECHNOLOGY, Suwon-si (KR)

(72) Inventors: Jeong-Seok Ha, Daejeon (KR); Woo-Myoung Park, Suwon-si (KR); Sang-Ha Lee, Seoul (KR); Jae-Yoon Lee, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 53 days.

(21) Appl. No.: 14/860,007

(22) Filed: Sep. 21, 2015

(65) Prior Publication Data
US 2016/0087652 A1    Mar. 24, 2016

(30) Foreign Application Priority Data

Sep. 19, 2014  (KR) ......................... 10-2014-0125040

(51) Int. Cl.
| | | |
|---|---|---|
| *G06F 11/10* | (2006.01) | |
| *H03M 13/29* | (2006.01) | |
| *H03M 13/27* | (2006.01) | |

(52) U.S. Cl.
CPC ... *H03M 13/2948* (2013.01); *H03M 13/2757* (2013.01); *H03M 13/2778* (2013.01);
(Continued)

(58) Field of Classification Search
CPC ...................................................... G06F 11/10
(Continued)

(56) References Cited

U.S. PATENT DOCUMENTS

| | | | | |
|---|---|---|---|---|
| 6,031,874 A | * | 2/2000 | Chennakeshu | ....... H04L 1/0058 |
| | | | | 375/262 |
| 6,229,824 B1 | * | 5/2001 | Marko | .................. H04L 1/0041 |
| | | | | 370/477 |

(Continued)

FOREIGN PATENT DOCUMENTS

KR    10-0330980    4/2002

OTHER PUBLICATIONS

IEEE Transactions on Wireless Communications, pp. 4004-4013, A. Fabregas and A. Grant, "Capacity approaching codes for non-coherent orthogonal modulation", Nov. 1, 2007.

*Primary Examiner* — Fritz Alphonse
(74) *Attorney, Agent, or Firm* — McAndrews, Held & Malloy, Ltd.

(57) ABSTRACT

The present disclosure relates to a pre-$5^{th}$-generation (5G) or 5G communication system to be provided for supporting higher data rates beyond $4^{th}$-generation (4G) communication system such as a long term evolution (LTE). A method for transmitting a signal in a signal transmitting apparatus in a communication system supporting a bit-interleaved coded modulation with iterative decoding (BICM-ID) scheme is provided. The method includes performing an outer encoding operation; performing an interleaving operation on the outer code corresponding to an interleaving scheme which is based on a preset generation matrix to generate an interleaved signal; performing an inner encoding operation; performing a modulating operation; and transmitting the modulated signal, wherein the generation matrix is generated by applying at least one of a preset column permutation rule and a preset row permutation rule to a generation matrix for a quasi-cyclic (QC) interleaver.

24 Claims, 12 Drawing Sheets

(52) U.S. Cl.
CPC ... *H03M 13/2933* (2013.01); *H03M 13/2939* (2013.01); *H03M 13/2957* (2013.01)

(58) Field of Classification Search
USPC .......................... 714/753, 755, 790, 792, 795
See application file for complete search history.

(56) References Cited

U.S. PATENT DOCUMENTS

| | | | |
|---|---|---|---|
| 6,631,491 B1 | 10/2003 | Shibutani et al. | |
| 8,254,245 B2* | 8/2012 | Kim | H04L 1/0071 370/207 |
| 2010/0118800 A1* | 5/2010 | Kim | H04L 1/0071 370/329 |
| 2014/0153625 A1* | 6/2014 | Vojcic | H04L 1/005 375/224 |

* cited by examiner

FIG.5

APPARATUS AND METHOD FOR TRANSMITTING/RECEIVING SIGNAL IN COMMUNICATION SYSTEM SUPPORTING BIT-INTERLEAVED CODED MODULATION WITH ITERATIVE DECODING SCHEME

RELATED APPLICATION(S)

This application claims the benefit under 35 U.S.C. §119 (a) of a Korean patent application filed in the Korean Intellectual Property Office on Sep. 19, 2014, assigned Serial No. 10-2014-0125040, the entire disclosure of which is incorporated herein by reference.

BACKGROUND

The present disclosure relates to an apparatus and method for transmitting/receiving a signal in a communication system, and more particularly, to an apparatus and method for transmitting/receiving a signal in a communication system supporting a bit-interleaved coded modulation with iterative decoding (BICM-ID) scheme.

To meet the demand for wireless data traffic, which has increased since deployment of 4th-generation (4G) communication systems, efforts have been made to develop an improved 5th-generation (5G) or pre-5G communication system. Therefore, the 5G or pre-5G communication system is also called a 'beyond 4G network' or a 'post long-term evolution (LTE) system.'

It is considered that the 5G communication system will be implemented in millimeter wave (mmWave) bands, e.g., 60 GHz bands, so as to accomplish higher data rates. To reduce propagation loss of radio waves and increase a transmission distance, a beam forming technique, a massive multiple-input multiple-output (MIMO) technique, a full dimensional MIMO (FD-MIMO) technique, an array antenna technique, an analog beam forming technique, and a large scale antenna technique are discussed in 5G communication systems.

In addition, in 5G communication systems, development for system network improvement is under way based on advanced small cells, cloud radio access networks (RANs), ultra-dense networks, a device-to-device (D2D) communication, a wireless backhaul, a moving network, a cooperative communication, coordinated multi-points (CoMP), reception-end interference cancellation, and the like.

In the 5G system, a hybrid frequency shift keying (FSK); quadrature amplitude modulation (QAM) modulation (FQAM); a sliding-window superposition coding (SWSC) (e.g., as an advanced coding modulation (ACM) scheme); a filter bank multi carrier (FBMC) scheme, a non-orthogonal multiple Access (NOMA) scheme, and a sparse code multiple access (SCMA) scheme (e.g., as an advanced access technology) have been developed.

Communication systems have evolved to support a high data rate to satisfy wireless data traffic demand. For example, such communication systems have evolved to enhance spectral efficiency and increase channel capacity to increase data rate employing various communication schemes, such as an orthogonal frequency division multiplexing (OFDM) scheme, a multiple-input/multiple-output (MIMO) scheme, and the like.

Cell-edge user equipments (UEs) face situations in which a signal-to-noise ratio (SNR) is low at a cell edge region (which is far from a cell center), or in which a carrier-to-interference and noise ratio (CINR) is low due to great interference from a base station (which is located at a neighbor cell). Such situations may be a factor that may degrade total system performance of the communication system. As a result, certain communication systems have developed various schemes to increase transmission efficiency for cell-edge UEs, e.g., an inter-cell interference-coordination (ICIC) scheme, a coordinated multi-points (CoMP) scheme, an interference cancellation scheme, and the like.

BICM-ID scheme is another scheme that may support a high data rate by increasing channel capacity. The BICM-ID scheme will be described below.

In a coded modulation (CM) system, a typical approach is a scheme of using an interleaver to decrease bit correlation relation between a channel code and a mapper. Performance of the interleaver may be determined according the following two elements.

The first element that may affect performance is hardware complexity. Generally, an interleaver performs an operation of changing an order of input bits. As the number of the input bits increases, the size of the interleaver increases and in turn, the hardware complexity increases. The number of the input bits which are input to the interleaver needs to be considered on designing the interleaver.

The second element that may affect the performance of the interleaver is error rate. In certain communication systems, the BICM-ID scheme may have a function similar to an error correction code. As such, an interleaver configuration that has a low error rate becomes an important factor for enhancing total system performance. However, as described above, if the number of input bits which are input to the interleaver is increased, the interleaver size is increased as well.

Generally, a random interleaver has the best error rate performance. Performance of a random interleaver depends on knowing which one among all input bits is input at related input location. The random interleaver requires information on all of N input bits, from 1 to N, upon inputting an input signal of a length N, i.e., an input signal including the N input bits. However, since such random interleavers require information on all input bits, hardware complexity is increased and total system throughput is decreased.

So, even though the random interleaver has the best performance, it is difficult to implement the random interleaver due to hardware complexity in a practical communication system. Various studies for an interleaver with decreased hardware complexity and good performance have been in development.

A typical interleaver of this sort is a block interleaver. The block interleaver will be described below.

The block interleaver has a structured characteristic. The block interleaver may store a structure of the block interleaver using a relatively small amount of information. Specifically, one integrated interleaver may be designed using a plurality of block interleavers. In this case, each of the plurality of block interleavers may be regarded as a structured interleaver.

The integrated interleaver has a form similar to a random interleaver. The performance of the integrated interleaver is similarly good.

However, it may be difficult to implement such integrated interleaver for several reasons. First, while the integrated interleaver has short processing delay time compared to a conventional random interleaver, the integrated interleaver still has long processing delay time. Specifically, in a case of long length information with many bits needing to be processed, it is difficult to implement the integrated interleaver for similar reasons as the random interleaver.

Second, in a case where convolutional code uses the number of memories is 1 as an inner code, block interleavers included in the integrated interleaver may not support a sequential decoding operation, which is as an advantage of a convolutional code. Put another way, for this reason, an advantage of a signal receiving apparatus may not be supported, and as such, it may be difficult to implement the integrated interleaver.

The above information is presented as background information only to assist with an understanding of the present disclosure. No determination has been made, and no assertion is made, as to whether any of the above might be applicable as prior art with regard to the present disclosure.

SUMMARY

An aspect of the present disclosure is to address at least the above-mentioned problems and/or disadvantages and to provide at least the advantages described below. Accordingly, an aspect of the present disclosure is to propose an apparatus and method for transmitting/receiving a signal in a communication system supporting a BICM-ID scheme.

Another aspect of the present disclosure is to provide an apparatus and method for transmitting/receiving a signal in a communication system supporting a BICM-ID scheme that decreases processing delay time.

Another aspect of the present disclosure is to provide an apparatus and method for transmitting/receiving a signal that decreases hardware complexity in a communication system supporting a BICM-ID scheme.

Another aspect of the present disclosure is to provide an apparatus and method for transmitting/receiving a signal that decreases a hardware size in a communication system supporting a BICM-ID scheme.

Another aspect of the present disclosure is to provide an apparatus and method for transmitting/receiving a signal that decreases an error rate in a communication system supporting a BICM-ID scheme.

Another aspect of the present disclosure is to provide an apparatus and method for transmitting/receiving a signal that increases total system throughput in a communication system supporting a BICM-ID scheme.

Another aspect of the present disclosure is to provide an apparatus and method for transmitting/receiving a signal that increases an information processing speed in a communication system supporting a BICM-ID scheme.

Another aspect of the present disclosure is to provide an apparatus and method for transmitting/receiving a signal that supports a flexible hardware structure in a communication system supporting a BICM-ID scheme.

In accordance with an aspect of the present disclosure, a method for transmitting a signal in a signal transmitting apparatus in a communication system supporting a bit-interleaved coded modulation with iterative decoding (BICM-ID) scheme is provided. The method includes performing an outer encoding operation on an input message based on a preset outer encoding scheme to generate an outer code; performing an interleaving operation on the outer code corresponding to an interleaving scheme which is based on a preset generation matrix to generate an interleaved signal; performing an inner encoding operation which is based on a preset inner encoding scheme on the interleaved signal to generate an inner code; performing a modulating operation on the inner code based on a preset modulation scheme to generate a modulated signal; and transmitting the modulated signal, wherein the pre-set generation matrix is generated by applying at least one of a preset column permutation rule and a preset row permutation rule to a generation matrix for a quasi-cyclic (QC) interleaver.

In accordance with another aspect of the present disclosure, a method for receiving a signal in a signal receiving apparatus in a communication system supporting a bit-interleaved coded modulation with iterative decoding (BICM-ID) scheme is provided. The method includes performing a demodulating operation on a received signal based on a preset demodulation scheme to generate a demodulated signal; performing an inner decoding operation on the demodulated signal based on an inner decoding scheme which corresponds to an inner encoding scheme which is used in a signal transmitting apparatus to generate extrinsic information; performing a deinterleaving operation on the extrinsic information based on a deinterleaving scheme which corresponds to an interleaving scheme which is used in the signal transmitting apparatus to generate a priori information; and performing an outer decoding operation on the a priori information based on an outer decoding operation which corresponds to an inner encoding scheme which is used in the signal transmitting apparatus to generate extrinsic information, wherein the interleaving scheme is based on a preset generation matrix, and wherein the generation matrix is generated by applying at least one of a preset column permutation rule and a preset row permutation rule to a generation matrix for a quasi-cyclic (QC) interleaver.

In accordance with another aspect of the present disclosure, a signal transmitting apparatus in a communication system supporting a bit-interleaved coded modulation with iterative decoding (BICM-ID) scheme is provided. The signal transmitting apparatus includes an outer encoder configured to perform an outer encoding operation on an input message based on a preset outer encoding scheme to generate an outer code; an interleaver configured to perform an interleaving operation on the outer code corresponding to an interleaving scheme which is based on a preset generation matrix to generate an interleaved signal; an inner encoder configured to perform an inner encoding operation which is based on a preset inner encoding scheme on the interleaved signal to generate an inner code; and a mapper configured to perform a modulating operation on the inner code based on a preset modulation scheme to generate a modulated signal, and transmit the modulated signal, wherein the pre-set generation matrix is generated by applying at least one of a preset column permutation rule and a preset row permutation rule to a generation matrix for a quasi-cyclic (QC) interleaver.

In accordance with another aspect of the present disclosure, a signal receiving apparatus in a communication system supporting a bit-interleaved coded modulation with iterative decoding (BICM-ID) scheme is provided. The signal receiving apparatus includes a demapper configured to perform a demodulating operation on a received signal based on a preset demodulation scheme to generate a demodulated signal; an inner decoder configured to perform an inner decoding operation on the demodulated signal based on an inner decoding scheme which corresponds to an inner encoding scheme which is used in a signal transmitting apparatus to generate extrinsic information; a deinterleaver configured to perform a deinterleaving operation on the extrinsic information based on a deinterleaving scheme which corresponds to an interleaving scheme which is used in the signal transmitting apparatus to generate a priori information; and an outer decoder configured to perform an outer decoding operation on the a priori information based on an outer decoding operation which corresponds to an inner encoding scheme which is used in the signal transmitting apparatus to generate extrinsic information, wherein the interleaving scheme is based on a preset generation matrix, and wherein the pre-set generation matrix is generated by applying at least one of a preset column permutation rule and a preset row permutation rule to a generation matrix for a quasi-cyclic (QC) interleaver.

Other aspects, advantages, and salient features of the disclosure will become apparent to those skilled in the art from the following detailed description, which, taken in conjunction with the annexed drawings, discloses exemplary embodiments.

BRIEF DESCRIPTION OF THE DRAWINGS

The above and other aspects, features and advantages of certain exemplary embodiments of the present disclosure will be more apparent from the following description taken in conjunction with the accompanying drawings, in which:

FIG. 5 schematically illustrates an example of a structure of a generation matrix of a double QC interleaver in a communication system supporting a BICM-ID scheme according to an embodiment of the present disclosure;

Throughout the drawings, it should be noted that like reference numbers are used to depict the same or similar elements, features, and structures.

DETAILED DESCRIPTION

Figure 1:
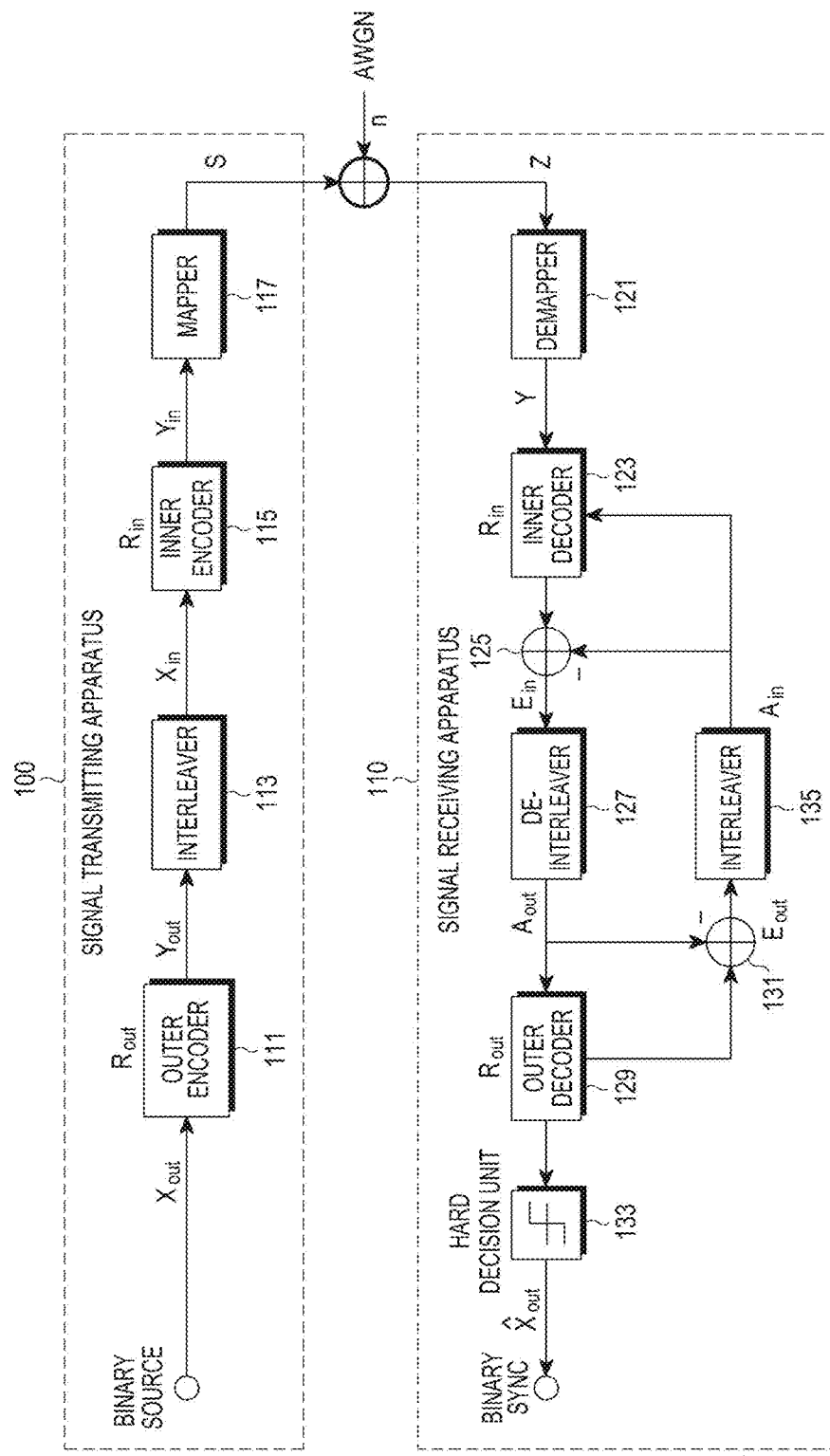
FIG. 1 schematically illustrates a structure of a communication system supporting a BICM-ID scheme according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

Certain words and phrases are used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions of other words and phrases are provided throughout this patent document, yet other words and phrases should be understood those of ordinary skill in the art. In most instances, such definitions apply to prior, as well as future, uses of such defined words and phrases.

Additionally, it is to be understood that the singular forms "a," "an," and "the" include plural referents unless the context clearly dictates otherwise. Thus, for example, reference to "a component surface" includes reference to one or more of such surfaces.

Although ordinal numbers such as "first," "second," and so forth will be used to describe various components, those components are not limited herein. The terms are used only for distinguishing one component from another component. For example, a first component may be referred to as a second component and vice versa. That is, a second component may also be referred to as a first component, without departing from the teaching of the inventive concept. The term "and/or" used herein includes any and all combinations of one or more of the associated listed items.

The terminology used herein is for the purpose of describing various embodiments only and is not intended to be limiting. As used herein, the singular forms are intended to include the plural forms as well, unless the context clearly indicates otherwise. It will be further understood that the terms "comprises" and/or "has," when used in this specification, specify the presence of a stated feature, number, step, operation, component, element, or combination thereof, but do not preclude the presence or addition of one or more other features, numbers, steps, operations, components, elements, or combinations thereof.

The terms used herein, including technical and scientific terms, have the same meanings as terms that are generally understood by those skilled in the art, as long as the terms are not differently defined. It should be understood that terms defined in a generally-used dictionary have meanings coinciding with those of terms in the related technology.

According to various embodiments of the present disclosure, an electronic device may include communication functionality. For example, an electronic device may be a smart phone, a tablet personal computer (PC), a mobile phone, a video phone, an e-book reader, a desktop PC, a laptop PC, a netbook PC, a personal digital assistant (PDA), a portable multimedia player (PMP), an mp3 player, a mobile medical device, a camera, a wearable device (e.g., a head-mounted device (HMD), electronic clothes, electronic braces, an electronic necklace, an electronic appcessory, an electronic tattoo, or a smart watch), and/or the like.

According to various embodiments of the present disclosure, an electronic device may be a smart home appliance with communication functionality. A smart home appliance may be, for example, a television, a digital video disk/digital versatile disk (DVD) player, an audio, a refrigerator, an air conditioner, a vacuum cleaner, an oven, a microwave oven, a washer, a dryer, an air purifier, a set-top box, a TV box (e.g., Samsung HomeSync™, Apple TV™, or Google TV™), a gaming console, an electronic dictionary, an electronic key, a camcorder, an electronic picture frame, and/or the like.

According to various embodiments of the present disclosure, an electronic device may be a medical device (e.g., magnetic resonance angiography (MRA) device, a magnetic resonance imaging (MRI) device, computed tomography (CT) device, an imaging device, or an ultrasonic device), a navigation device, a global positioning system (GPS) receiver, an event data recorder (EDR), a flight data recorder (FDR), an automotive infotainment device, a naval electronic device (e.g., naval navigation device, gyroscope, or compass), an avionic electronic device, a security device, an industrial or consumer robot, and/or the like.

According to various embodiments of the present disclosure, an electronic device may be furniture, part of a building/structure, an electronic board, electronic signature receiving device, a projector, various measuring devices (e.g., water, electricity, gas or electro-magnetic wave measuring devices), and/or the like that include communication functionality.

According to various embodiments of the present disclosure, an electronic device may be any combination of the foregoing devices. In addition, it will be apparent to one having ordinary skill in the art that an electronic device according to various embodiments of the present disclosure is not limited to the foregoing devices.

According to various embodiments of the present disclosure, for example, a signal receiving apparatus may be an electronic device.

A method and apparatus proposed in an embodiment of the present disclosure may be applied to various communication systems such as a digital video broadcasting system; a mobile broadcasting service; a digital multimedia broadcasting (DMB) service; a digital video broadcasting-handheld (DVP-H) service; an advanced television systems committee-mobile/handheld (ATSC-M/H) service; an internet protocol television (IPTV) service; a moving picture experts group (MPEG) media transport (MMT) system; an evolved packet system (EPS); a long term evolution (LTE) mobile communication system; an LTE-advanced (LTE-A) mobile communication system; a high speed downlink packet access (HSDPA) mobile communication system; a high speed uplink packet access (HSUPA) mobile communication system; a high rate packet data (HRPD) mobile communication system proposed in a $3^{rd}$ generation project partnership 2 (3GPP2); a wideband code division multiple access (WCDMA) mobile communication system proposed in the 3GPP2; a code division multiple access (CDMA) mobile communication system proposed in the 3GPP2; an institute of electrical and electronics engineers (IEEE) mobile communication system a mobile internet protocol (Mobile IP) system, and/or the like.

An embodiment of the present disclosure proposes a method for designing an interleaver that decreases hardware complexity and acquires a low error rate. Specifically, an embodiment of the present disclosure proposes a method for configuring an interleaver for decreasing hardware complexity and acquiring a low error rate where a signal transmitting apparatus uses a hybrid frequency shift keying (FSK) and quadrature amplitude modulation (QAM) modulation (FQAM) scheme as a modulation scheme, and uses a concatenated code as an encoding scheme, i.e., a double quasi-cyclic (QC) interleaver.

FIG. 1 schematically illustrates a structure of a communication system supporting a BICM-ID scheme according to an embodiment of the present disclosure.

Referring to FIG. 1, an embodiment of the present disclosure proposes a new interleaver that still has performance similar to a random interleaver and a structured characteristic. A typical QC interleaver used as a structured interleaver may decrease performance of a communication system. As a result, an embodiment of the present disclosure proposes a double QC interleaver that has performance similar to a random interleaver.

The communication system includes a signal transmitting apparatus 100 and a signal receiving apparatus 110. The signal transmitting apparatus 100 includes an outer encoder 111, an interleaver 113, an inner encoder 115, and a mapper 117.

The interleaver 113 is a double QC interleaver according to an embodiment of the present disclosure. The double QC interleaver 113 according to an embodiment of the present disclosure has improved performance compared to a general QC interleaver.

The signal receiving apparatus 110 includes a demapper 121, an inner decoder 123, an exclusive OR (XOR) adder 125, a deinterleaver 127, an outer decoder 129, an XOR adder 131, a hard decision unit 133, and an interleaver 135.

The signal transmitting apparatus 100 will be described next below.

A binary message $X_{out}$ including K bits is input to the outer encoder 111. The outer encoder 111 encodes the binary message $X_{out}$ based on a preset outer encoding scheme, e.g., an outer encoding scheme with a code rate $R_{out}$ to generate an outer code $Y_{out}$ including $$L = \frac{K}{R_{out}}$$

bits, and outputs the generated outer code $Y_{out}$ to the interleaver 113.

The interleaver 113 performs an interleaving operation on the outer code $Y_{out}$ output from the outer encoder 111 based on a preset interleaving scheme. The preset interleaving scheme includes a double QC interleaving scheme to generate an interleaved signal $X_{in}$, and outputs the interleaved signal $X_{in}$ to the inner encoder 115.

The inner encoder 115 encodes the interleaved signal $X_{in}$, output from the interleaver 113, based on a preset inner encoding scheme, e.g., an inner encoding scheme with a code rate $R_{in}$ to generate an inner code $Y_{in}$ including $$N = \frac{L}{R_{in}}$$

bits, and outputs the generated inner code $Y_{in}$ to the mapper 117. The inner encoding scheme may be implemented with various forms, and a description of all variations which should be readily apparent to a skilled artisan will be omitted herein.

The mapper 117 maps the inner code $Y_{in}$ output from the inner encoder 115 based on a preset mapping scheme to generate a final transmitted signal S, and transmits the final transmitted signal S to the signal receiving apparatus 110.

For example, the mapping scheme is an M-ary FQAM scheme, the M-ary FQAM scheme is a modulation scheme which is based on an FSK scheme of which a modulation order is $M_{FSK}$ and a QAM scheme of which a modulation order is $M_{QAM}$, and a modulation order of the M-ary FQAM scheme is $M = M_{FSK} M_{QAM} = 2^m$.

If a signal is processed in the described manner, a final code rate of a signal output from the signal transmitting apparatus 100 is $$R = \frac{K}{N} = R_{out} R_{in}.$$

Meanwhile, the final transmitted signal S is input to the demapper 121 included in the signal receiving apparatus 110 through a channel, e.g., an additive white Gaussian noise (AWGN) channel. It will be assumed that variance of a noise signal n∈l in the AWGN channel is $$\sigma^2 = \frac{N_0}{2}.$$

It will be assumed that the noise signal n∈l follows a probability density function $p_n(n)$, and has an independent and identically distributed (i.i.d.) characteristic. Further, a received signal Z, which is input to the demapper 121 in the signal receiving apparatus 110, may be expressed as Z=S+n.

The demapper 121 demodulates the received signal Z based on a demodulation scheme. The demodulation scheme corresponds to a modulation scheme that is used in the mapper 117 included in the signal transmitting apparatus 100, i.e., an M-ary FQAM scheme to output a demodulated signal Y to the inner decoder 123.

The inner decoder 123 performs an inner decoding operation on the demodulated signal Y output from the demapper 121 based on a preset inner decoding scheme, e.g., an inner decoding scheme which is based on a code rate $R_{in}$ and a priori information $A_{in}$ which is output from the interleaver 135 to generate extrinsic information $E_{in}$, and outputs the generated extrinsic information $E_{in}$ to the XOR adder 125.

The XOR adder 125 performs an XOR operation on the a priori information $A_{in}$ output from the interleaver 135 and the extrinsic information $E_{in}$ output from the inner decoder 123 to output the extrinsic information $E_{in}$ to the deinterleaver 127.

The deinterleaver 127 deinterleaves the extrinsic information $E_{in}$ output from the XOR adder 125 based on a deinterleaving scheme. The deinterleaving scheme corresponds to an interleaving scheme, which is used in the interleaver 113, that is included in the signal transmitting apparatus 100. The deinterleaving scheme generates a priori information $A_{out}$ output to the outer decoder 129 and the XOR adder 131.

The outer decoder 129 performs an outer decoding operation on the a priori information $A_{out}$ output from the deinterleaver 127 based on an outer decoding scheme which corresponds to an outer encoding scheme which is used in the outer encoder 111 included in the signal transmitting apparatus 100 to generate extrinsic information $E_{out}$, and outputs the generated extrinsic information $E_{out}$ to the hard decision unit 133 and the XOR adder 131.

The XOR adder 131 performs an XOR operation on the extrinsic information $E_{out}$ output from the outer decoder 129 and the a priori information $A_{out}$ output from the deinterleaver 127 to output the extrinsic information $E_{out}$ to the interleaver 135. The interleaver 135 performs an interleaving operation on the extrinsic information $E_{out}$ based on a preset interleaving scheme, and outputs the interleaved signal to the XOR adder 125 and the inner decoder 123.

Since information is repetitively transmitted/received between the inner decoder 123 and the outer decoder 129 in the manner described above, an iterative decoding operation is performed. The information which is transmitted/received between the inner decoder 123 and the outer decoder 129, i.e., each of a priori information $A_{out}$, a priori information $A_{in}$, extrinsic information $E_{in}$, and extrinsic information $E_{out}$ is a log-likelihood-ratio (LLR) value. For example, an initial value of the a priori information $A_{out}$ is set to 0 when the signal receiving apparatus 110 performs an iterative decoding operation.

While the outer encoder 111, the interleaver 113, the inner encoder 115, and the mapper 117 are described as separate units, it is to be understood that this is merely for convenience of description. In other words, two or more of the outer encoder 111, the interleaver 113, the inner encoder 115, and the mapper 117 may be incorporated into a single unit.

While the demapper 121, the inner decoder 123, the XOR adder 125, the deinterleaver 127, the outer decoder 129, the XOR adder 131, the hard decision unit 133, and the interleaver 135 are described as separate units, it is to be understood that this is merely for convenience of description. In other words, two or more of the demapper 121, the inner decoder 123, the XOR adder 125, the deinterleaver 127, the outer decoder 129, the XOR adder 131, the hard decision unit 133, and the interleaver 135 may be incorporated into a single unit. Similarly, a structure of a communication system supporting a BICM-ID scheme according to an embodiment of the present disclosure has been described with reference to FIG. 1, and an inner structure of an inner encoder in a communication system supporting a BICM-ID scheme according to an embodiment of the present disclosure will be described with reference to FIG. 2.

Figure 2:
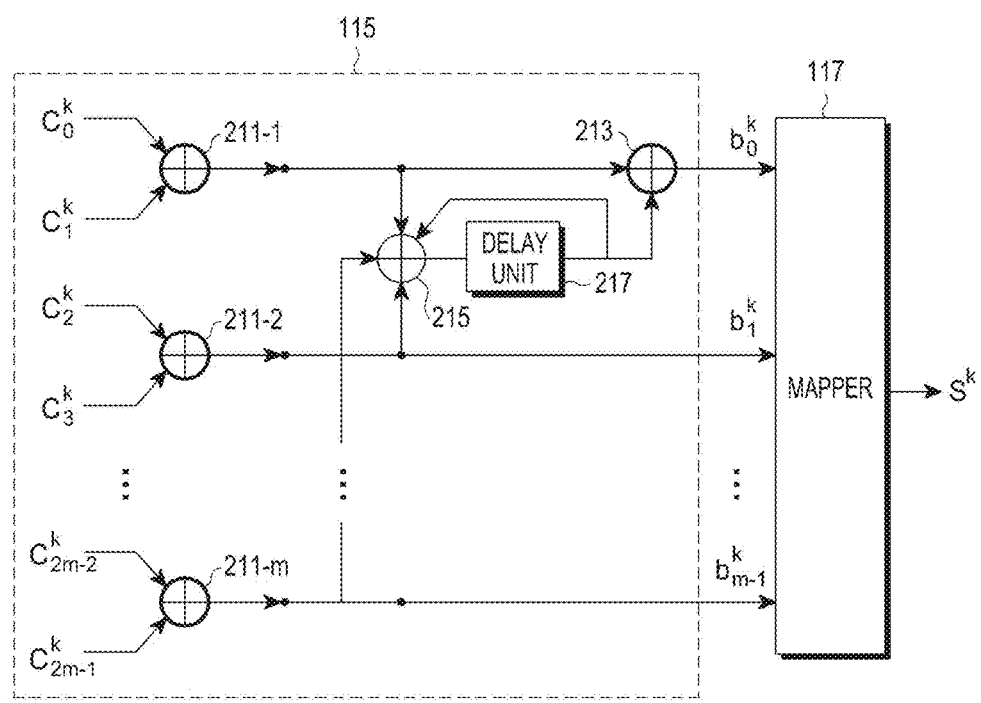
FIG. 2 schematically illustrates an inner structure of an inner encoder in a communication system supporting a BICM-ID scheme according to an embodiment of the present disclosure.

FIG. 2 schematically illustrates an inner structure of an inner encoder in a communication system supporting a BICM-ID scheme according to an embodiment of the present disclosure. An inner encoder in FIG. 2 is an inner encoder 115 as described in FIG. 1. The inner encoder 115 includes a plurality of XOR adders, e.g., m XOR adders, i.e., an XOR adder #1 (211-1), an XOR adder #2 (211-2), . . . , an XOR adder #m (211-$m$), an XOR adder 213, an XOR adder 215, and a delay unit 217.

As shown in FIG. 2, the inner encoder 115 is implemented with a 2-state trellis code form which is implemented with one memory, and a code rate $R_{in}$ of the inner encoder 115, which is 2. That is, to configure one point on a constellation for an FQAM scheme in a mapper 117 which is connected to the inner encoder 115, the inner encoder 115 requires an input including 2m bits.

$X_{in}$ is the input of the inner encoder 115, and is an interleaved signal $X_{in}$ output from an interleaver 113 that includes L bits. As a result, so the mapper 117 generates $$T = \frac{L}{2m}$$

FQAM symbols.

In FIG. 2, $c_{2m-1}^k$ denotes a bit included in the interleaved signal $X_{in}$, which is input to the inner encoder 115, k denotes a symbol index, and m denotes the number of bits included in a modulation symbol.

Further, $c_{2m-1}^k$ and $c_{2m-2}^k$ are input to a related XOR adder (e.g., 211-$m$), and the related XOR adder performs an XOR adding operation on $c_{2m-1}^k$ and $c_{2m-2}^k$ to generate $a_{m-1}^k$. That is, $c_{2m-1}^k$ and $c_{2m-2}^k$ are input to the XOR adder 211-$m$, the XOR adder 211-$m$ performs an XOR adding operation on $c_{2m-1}^k$ and $c_{2m-2}^k$ to generate $a_{m-1}^k$ and outputs $a_{m-1}^k$ to the XOR adder 215. The delay unit 217 delays an input signal by one symbol and outputs the delayed signal to each of the XOR adder 213 and the XOR adder 215.

In FIG. 2, $b_{m-1}^k$ denotes a bit included in an inner code $Y_{in}$ output from the inner encoder 115, and it may be understood that the inner code $Y_{in}$ includes m bits.

While the XOR adder 211-1, the XOR adder 211-2, ..., the XOR adder 211-$m$, the XOR adder 213, the XOR adder 215, and the delay unit 217 are described as separate units, it is to be understood that this is merely for convenience of description. In other words, two or more of the XOR adder 211-1, the XOR adder 211-2, ..., the XOR adder 211-$m$, the XOR adder 213, the XOR adder 215, and the delay unit 217 may be incorporated into a single unit.

An inner structure of an inner encoder in a communication system supporting a BICM-ID scheme according to an embodiment of the present disclosure been described with reference to FIG. 2, and a structure of a code used in an outer encoder and an inner encoder in a communication system supporting a BICM-ID scheme according to an embodiment of the present disclosure will be described with reference to FIG. 3.

Figure 3:
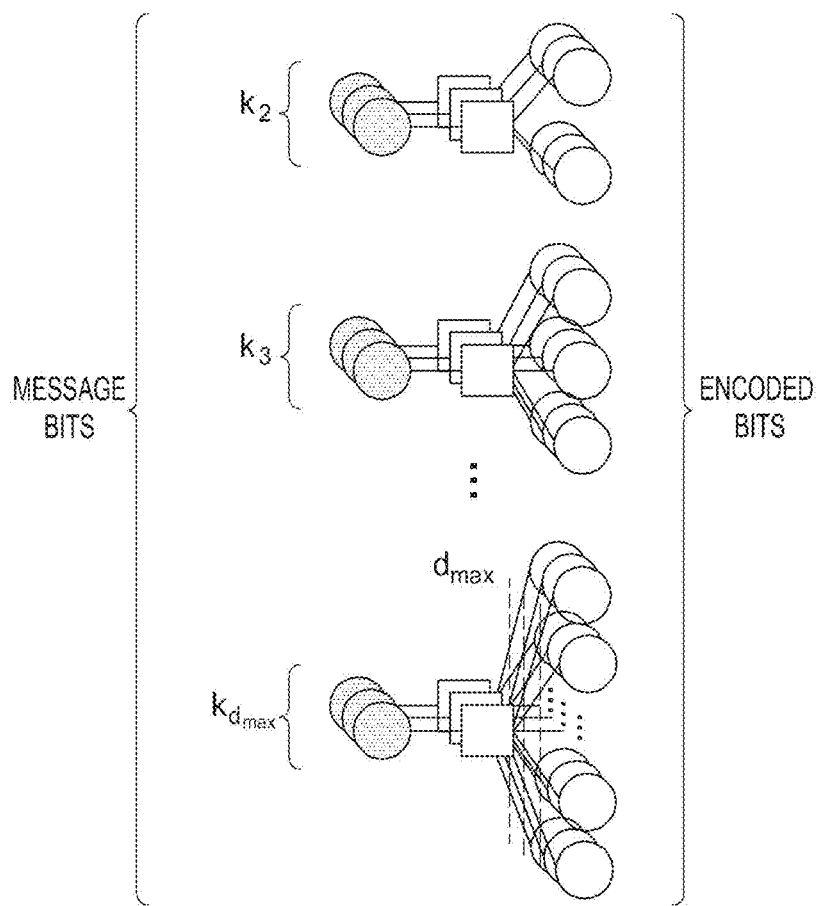
FIG. 3 schematically illustrates a structure of a code used in an outer encoder and an inner encoder in a communication system supporting a BICM-ID scheme according to an embodiment of the present disclosure.

Referring to FIG. 3, a code which is used in the outer encoder and the inner encoder is an irregular iterative code. For convenience, the code which is used in the outer encoder will be referred to as an outer code, and the code which is used in the inner encoder will be referred to as an inner code.

The irregular iterative code which is used as the outer encoder and the inner encoder is generated by encoding a binary source message signal that includes K bits based on a preset encoding scheme, and has L bits. Here, a structure of the irregular iterative code is determined based on degree distribution, and the degree distribution of the irregular repetition code may be expressed as Equation (1).

$$\Sigma \lambda_i = 1 \qquad (1)$$

In Equation (1), $\lambda_i$ denotes a distribution rate of an edge which is connected to a message bit with a degree i from edge perspective in an irregular iterative code structure. In Equation (1), $k_i$ denotes the number of message bits with a degree i, and satisfies a criterion of $\Sigma k_i = K$ and a criterion of $$k_i = \frac{\lambda_i L}{i}.$$

Further, in FIG. 3, $d_{max}$ denotes a maximum order. So, an outer code rate $R_{out}$ may be expressed as Equation (2).

$$R_{out} = \frac{1}{L} \sum k_i \qquad (2)$$

A structure of a code used in an outer encoder and an inner encoder in a communication system supporting a BICM-ID scheme according to an embodiment of the present disclosure has been described with reference to FIG. 3, and a constellation of an FQAM scheme used in a mapper in a communication system supporting a BICM-ID scheme according to an embodiment of the present disclosure will be now described with reference to FIG. 4.

Figure 4:
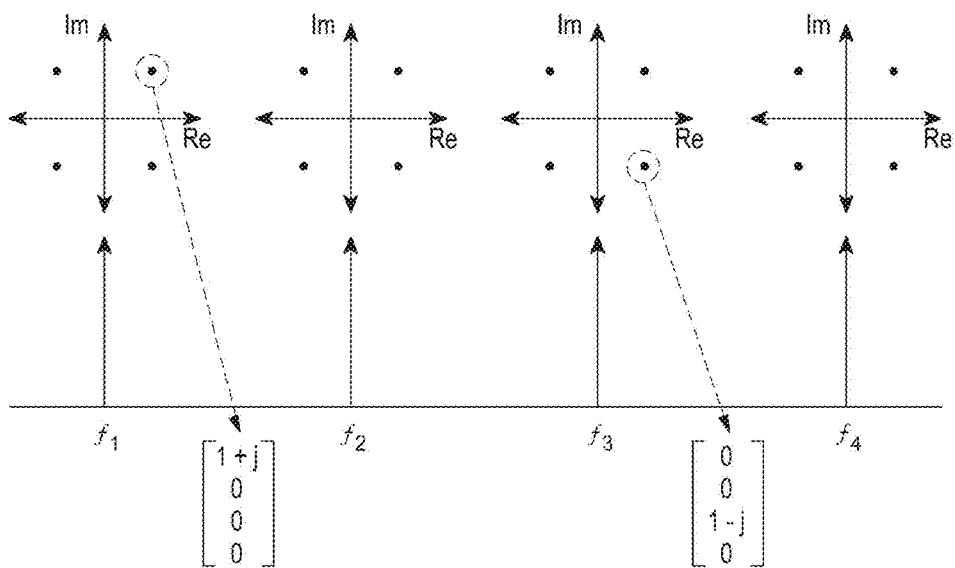
FIG. 4 schematically illustrates a constellation of an FQAM scheme used in a mapper in a communication system supporting a BICM-ID scheme according to an embodiment of the present disclosure.

Referring to FIG. 4, a constellation is illustrated having a 16-ary FQAM scheme which is based on a 4-FSK scheme and a 4-QAM scheme. As shown in FIG. 4, the constellation of the 16-ary FQAM scheme is expressed using different axes $f_1$ and $f_4$ among different frequencies, and expressed using a coordinate at a real axis and a coordinate at an imaginary axis for QAM modulation within the same frequency.

A constellation of an FQAM scheme used in a mapper in a communication system supporting a BICM-ID scheme according to an embodiment of the present disclosure has been described with reference to FIG. 4, and an example of a structure of a generation matrix of a double QC interleaver in a communication system supporting a BICM-ID scheme according to an embodiment of the present disclosure will be described with reference to FIG. 5.

Figure 5:
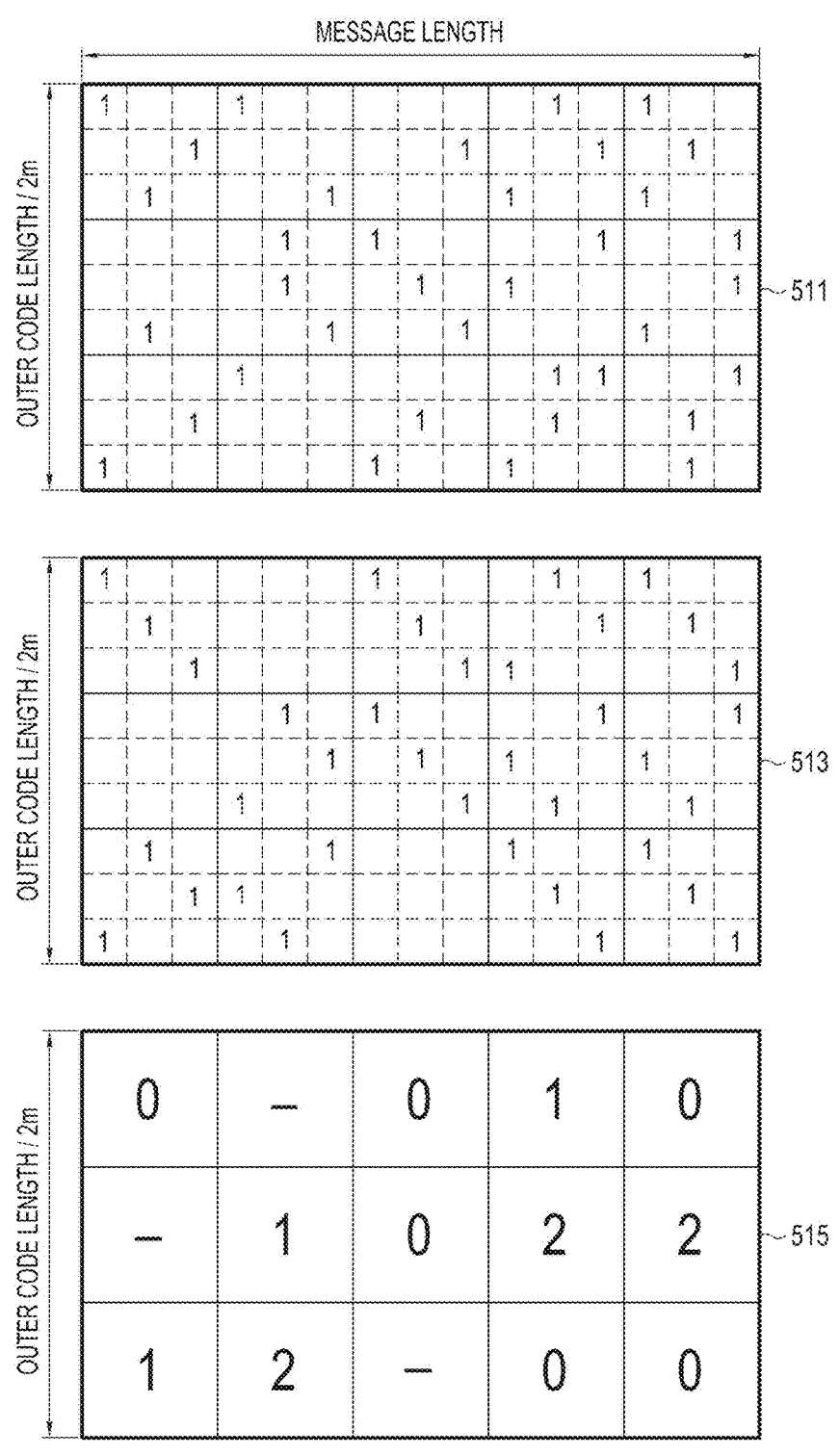

Referring to FIG. 5, a double QC interleaver as used in a communication system supporting a BICM-ID scheme according to an embodiment of the present disclosure, performs an operation of decreasing a correlation relation between a bit in an inner code and a bit in an outer code. So, if the double QC interleaver has randomness, it may be understood that performance of the double QC interleaver is improved.

In contrast, as is appreciated by the skilled artisan, a random interleaver would require many memories to store a structure of the random interleaver. If an interleaver has a regular structure, there are many advantages for hardware implementation. Specifically, an embodiment of the present disclosure proposes a structured interleaver, i.e., a double QC interleaver that is easily implemented with a hardware. Relatively fast encoding and decoding are possible using such an interleaver which has a QC structure.

Prior to a description of the double QC interleaver, a general QC interleaver will be described. A structure of a general QC interleaver may be expressed as a matrix Π. The matrix Π includes a plurality of partial matrices, and each of the partial matrices may be referred to as a partial matrix $A_{i,j}$. The partial matrix $A_{i,j}$ may be a circularly permutated matrix (CPM). It will be assumed that a size of the partial matrix $A_{i,j}$ is Q×Q. As a result, a matrix Π expresses a QC interleaver that includes $m_Q$×Q rows and $n_Q$×Q columns.

In an embodiment of the present disclosure, a column index of the matrix Π indicates location of a binary message bit of an outer code. Each of rows included in the matrix Π corresponds to a message bit set $c_i^k$ of an inner code. The message bit set of the inner code includes 2m input bits, and uses message bit values of an outer code which correspond to a column index of which a value is non-zero, e.g., 1 which is located at each row included in the matrix Π as an input bit of the message bit set of the inner code. This may be expressed as Equation (3).

$$c_i^k = X_{out}(\mu_i) \quad (3)$$

In Equation (3), $0 \le i \le 2m-1$ and $\Pi_{k,\mu_i}=1$. $\Pi_{k,\mu_i}$ denotes an element which exits at a point of a row k and a column $\mu_i$ of the matrix Π, and $\Pi_{k,\mu_i}=0$ for $2m \le j \le K-1$. As such, there are 2m values which are 1 at each row of the matrix Π, and the remaining values are 0.

Three matrix structures are illustrated in FIG. 5. Matrix 511 denotes a random interleaver for an outer code with code rate is 5/6 and a message length K=$n_Q \times Q$ is 15. Matrix 513 denotes a matrix of a double QC interleaver for an outer code with a code rate is 5/6 and a message length K=$n_Q \times Q$ is 15. Matrix 515 denotes a simplified matrix of a double QC interleaver for an outer code with a code rate is 5/6 and a message length K=$n_Q \times Q$ is 15.

Here, "1"s which are in each row in each of the matrices 511, 513, and 515, correspond to a message bit set $c_i^k$ of an inner code as described in FIG. 2. In FIG. 5, it will be assumed that m=2, so there are 4 (i.e., 2m=4) points in each row. A length of an outer code as an iterative code needs to be equal to the number of points included in matrices 511, 513 and 515 in FIG. 5. Thus, a length of each row included in the matrices in FIG. 5 is 15=18×5/6.

In FIG. 5, matrix 515 denotes a simplified matrix which is generated by changing the matrix 513 based on a structured characteristic of the double QC interleaver. In matrix 515, a part expressed as '-' denotes a part in which there is no "1" within the matrix 515. A related part in Matrix 515 is generated by shifting an identity matrix by a related number expressed in the related part in a preset direction, e.g., in a right direction. That is, each number in the matrix 515 denotes an index of a circularly permutated matrix (CPM). A detailed description of the index of the CPM will be omitted herein.

Meanwhile, if a structured interleaver is designed, a condition expressed as Equation (4) needs to be prevented.

$$c_{2l}^k = c_{2l+1}^k = X_{out}(\mu) \quad (4)$$

In Equation (4), $X_{out}(\mu)$ denotes arbitrary integers which satisfy a criterion of $0 \le l \le m-1$ and a criterion of $0 \le \mu \le K-1$. If a condition when a criterion expressed as Equation (4) is satisfied occurs, as described in FIG. 1, it may be understood that a value of $a_i^k$ is always 0 regardless of a value of $X_{out}(\mu)$.

As described above, 2m bit sets are input to an inner encoder 115, so a row order is 2m, and a column order is determined based on the number of times that message bits are repeated which correspond to an exponent of a CPM included in each column.

A structure of a matrix of a double QC interleaver proposed in an embodiment of the present disclosure is expressed in 513, and the matrix 513 will be described below. It may be understood that the more increased a column index of each row included in the matrix 513 is, the higher an order of an outer code bit which is connected to the column index of each row included in the matrix 513 is. If a double QC interleaver is implemented like the matrix 513, a structure of the double QC interleaver may be simply implemented. However, in such a case, a structure of input messages has uniformity, so it may be impossible to acquire randomness which is an intrinsic requirement of an interleaver.

An embodiment of the present disclosure, as such, proposes a structure of interleaving an order of outer code messages which are input to the double QC interleaver. That is, an embodiment of the present disclosure proposes a scheme of interleaving a column order of the double QC interleaver on a size basis. In this case, the double QC interleaver may have a very simple structure and maintain randomness. Here, the size is a size of a CPM.

When a column shift operation is performed on a matrix of the double QC interleaver on a circulant basis, columns included in the matrix of the double QC interleaver may be divided into $n_Q$ groups. It will be assumed that a pattern of changing an order of $n_Q$ groups is $\overline{L}=[L_1, L_2, \ldots, L_{n_Q}]$, and the $i_{th}$ value of $\overline{L}$ is $\overline{L}(i)$. Further, the column shift operation will be expressed as K:c→η. Here, c denotes a column index of a circulant of the double QC interleaver, and η denotes a column index of a circulant after the column shift operation is performed.

Based on such description, the column shift operation may be expressed as Πc=KΠ. Here, Πc denotes a matrix of a double QC interleaver after a column shift operation is performed.

As described above, a role of column shift operation K is to change a column index c of a matrix Π to a column index η of a matrix Πc. As a result, there is relation between the column index c of the matrix Π and the column index η of the matrix Πc expressed as η=$\overline{L}$(c).

Figure 6:
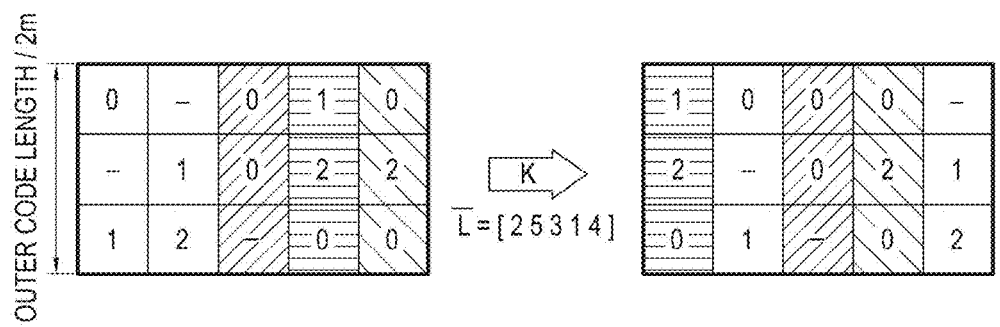
FIG. 6 schematically illustrates an example of a column shift process of a double QC interleaver in a communication system supporting a BICM-ID scheme according to an embodiment of the present disclosure.

FIG. 6 schematically illustrates an example of a column shift process of a double QC interleaver in a communication system supporting a BICM-ID scheme according to an embodiment of the present disclosure.

Referring to FIG. 6, a column shift process of a double QC interleaver in FIG. 6 is expressed based on a matrix structure of a simplified QC interleaver. In FIG. 6, a region which is equally shaded denotes a region of which a column degree is the same within a matrix of a QC interleaver. A column shift process of $\overline{L}$=[25314] is shown in FIG. 6. It may be understood, for example, that such a column shift process is performed based on a column shift operation, so that the first circulant column is shifted to the second circulant column, the second circulant column is shifted to the fifth circulant column, the third circulant column is shifted to the third circulant column, the fourth circulant column is shifted to the first circulant column, and the fifth circulant column is shifted to the fourth circulant column K.

An example of a column shift process of a double QC interleaver in a communication system supporting a BICM-ID scheme according to an embodiment of the present disclosure has been described with reference to FIG. 6, and another example of a column shift process of a double QC interleaver in a communication system supporting a BICM-ID scheme according to an embodiment of the present disclosure will be described with reference to FIG. 7.

Figure 7:
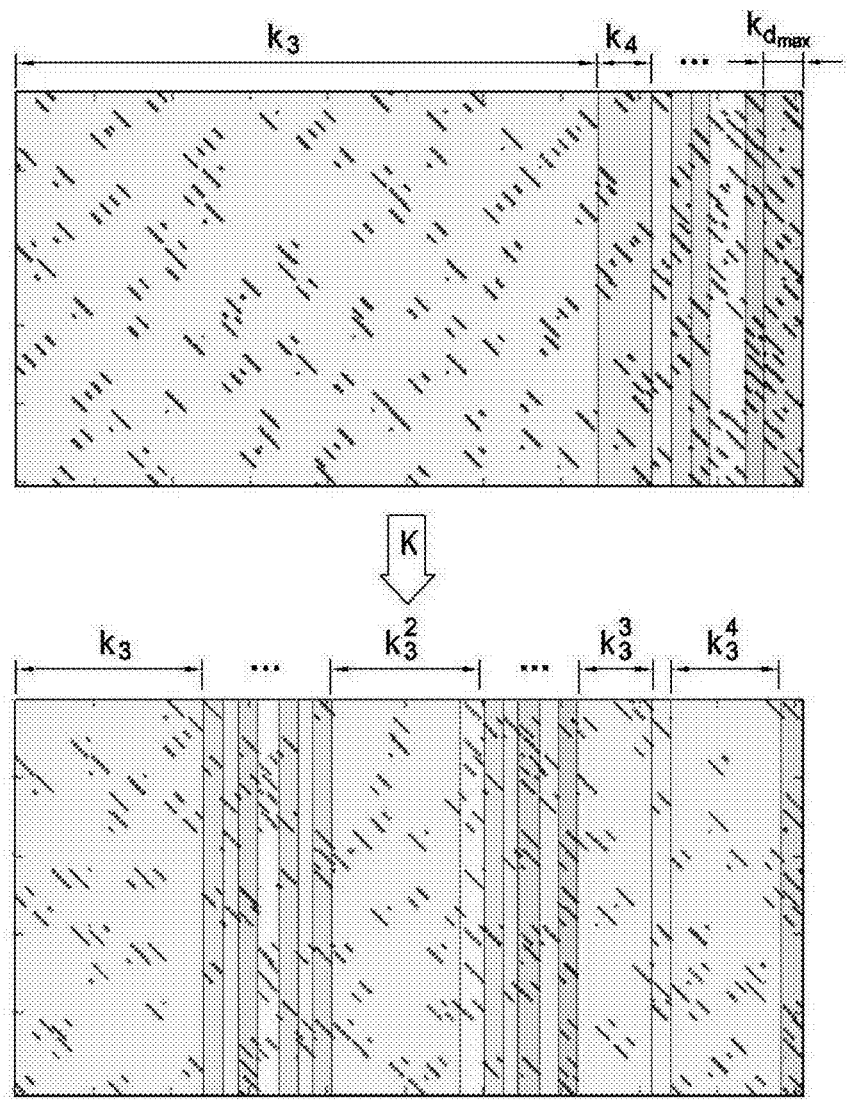
FIG. 7 schematically illustrates another example of a column shift process of a double QC interleaver in a communication system supporting a BICM-ID scheme according to an embodiment of the present disclosure.

Referring to FIG. 7, a column shift process of a double QC interleaver is expressed based on a matrix structure of an extended QC interleaver. A column shift process of K shown in FIG. 7 is performed in the manner described with reference to FIG. 6, so a detailed description will be omitted herein.

Another example of a column shift process of a double QC interleaver in a communication system supporting a BICM-ID scheme according to an embodiment of the present disclosure has been described with reference to FIG. 7, and performance of a QC interleaver in a communications system supporting a BICM-ID scheme according to an embodiment of the present disclosure will be described with reference to FIG. 8.

Figure 8:
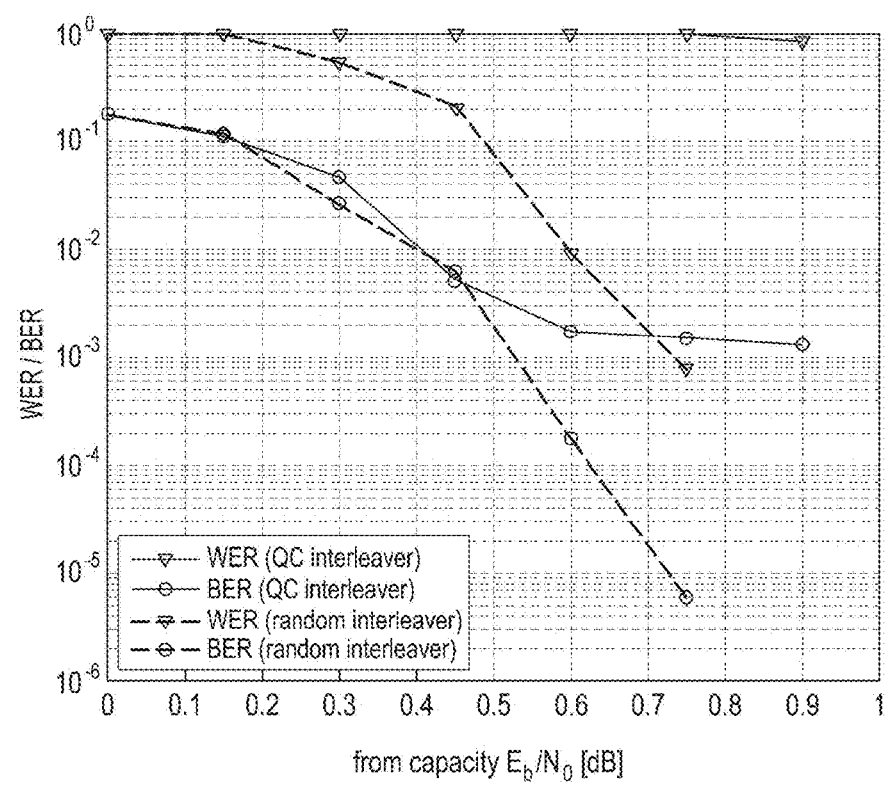
FIG. 8 schematically illustrates performance of a QC interleaver in a communications system supporting a BICM-ID scheme according to an embodiment of the present disclosure.

Referring to FIG. 8, performance of a QC interleaver and performance of a random interleaver are shown in FIG. 8. In an aspect of word error rate (WER), there is significant performance difference between the QC interleaver and the random interleaver. Meanwhile, in an aspect of bit error rate (BER), the performance of the QC interleaver is similar to the performance of the random interleaver. However, an error floor phenomenon occurs at a specific point in the QC interleaver in the aspect of the BER. Here, the specific point at which the error floor phenomenon occurs is 0.6 dB distant from channel capacity.

It is well known that this phenomenon generally occurs in a code of which a minimum distance d_min is relatively short, and which has many codewords with the minimum distance d_min. To enhance performance of a QC interleaver proposed in an embodiment of the present disclosure, for a QC interleaver and a random interleaver, an inverse trace process is performed in which a message of which message bits are 0 is encoded, and a weight of an error message, which is detected in a decoder, and a weight of a code, which is detected by encoding an error message, are detected in a process of transmitting and receiving the encoded message. This will be described further with reference to FIG. 9.

Figure 9:
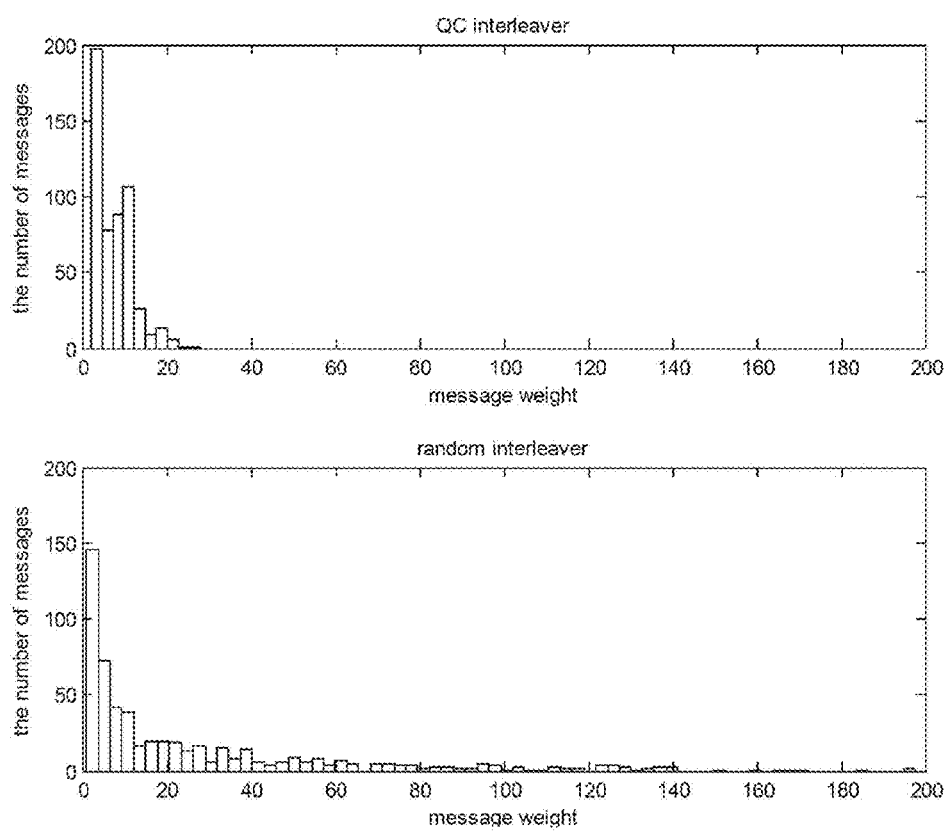
FIG. 9 schematically illustrates an example of weight distribution of an error message in a double QC interleaver in a communication system supporting a BICM-ID scheme according to an embodiment of the present disclosure.

FIG. 9 schematically illustrates an example of weight distribution of an error message in a QC interleaver in a communication system supporting a BICM-ID scheme according to an embodiment of the present disclosure. FIG. 9 illustrates a weight of an error message of a QC interleaver and a weight of an error message of a random interleaver at a point which is 0.6 dB distant from channel capacity.

As shown in FIG. 9, it may be understood that weights of an error message are various in a case of the random interleaver, and weights of an error message are relatively small in a case of the QC interleaver.

An example of weight distribution of an error message in a double QC interleaver in a communication system supporting a BICM-ID scheme according to an embodiment of the present disclosure has been described with reference to FIG. 9, and an example of weight distribution of an error codeword in a double QC interleaver in a communication system supporting a BICM-ID scheme according to an embodiment of the present disclosure will be described with reference to FIG. 10.

Figure 10:
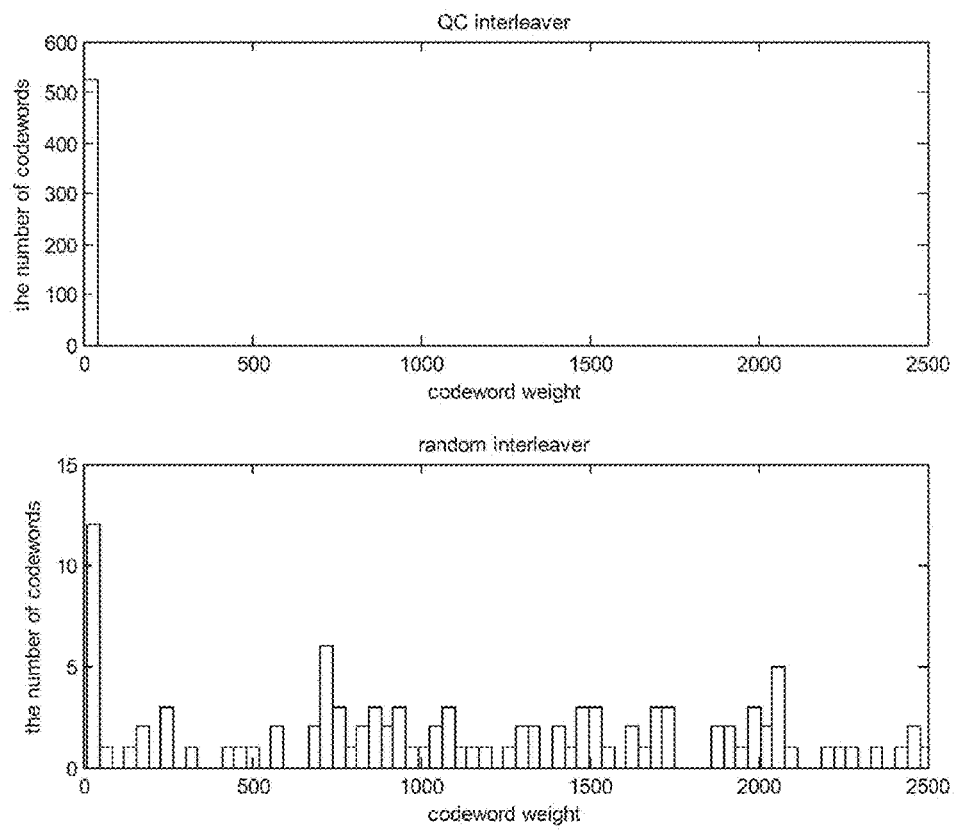
FIG. 10 schematically illustrates an example of weight distribution of an error codeword in a double QC interleaver in a communication system supporting a BICM-ID scheme according to an embodiment of the present disclosure.

Referring to FIG. 10, a weight of an error codeword of a double QC interleaver and a weight of an error codeword of a random interleaver at a point which is 0.6 dB distant from channel capacity are shown in FIG. 10. Here, the weight of the error codeword of the double QC interleaver and the weight of the error codeword of the random interleaver in FIG. 10 are similar to a weight of an error message of a QC interleaver and a weight of an error message of a random interleaver in FIG. 9, except that weight distribution is indicated by encoding a related error codeword.

As shown in FIG. 10, similar to the weight of the error message of the QC interleaver and the weight of the error message of the random interleaver in FIG. 9, weights of an error codeword are various in a case of the random interleaver, and weights of an error codeword are relatively small in a case of the double QC interleaver.

As described in FIG. 9 and FIG. 10, it may be understood that a double QC interleaver generates a plurality of codes with a low weight, and may degrade minimum distance characteristic. As a result, an embodiment of the present disclosure proposes a double QC interleaver for interleaving a row order, as well as a column order, to prevent a message with a low weight being generated as a codeword with a low weight. That is, the double QC interleaver is generated by applying a structured interleaver P which interleaves an order of rows of a matrix $\Pi c$ of the double QC interleaver on which a column shift operation is performed, as described above. The order of rows of the matrix $\Pi c$ of the double QC interleaver may be interleaved as expressed in Equation (5).

$$\Pi' = P\Pi_c \quad (5)$$

In Equation (5), P denotes the structured interleaver. For convenience, an operation which corresponds to the structured interleaver P will be referred to as a row permutation operation.

The row permutation operation will be described below. If an regular row permutation operation is applied in a double QC interleaver, rows are interleaved on a row element basis, not on a circulant basis in a column shift operation. So, if the regular row permutation operation is applied in the double QC interleaver, the double QC interleaver may not maintain a structure of a QC interleaver. However, the double QC interleaver may maintain easiness for hardware implementation of the QC interleaver since the regular row permutation operation is applied. This will be described with reference to FIG. 11.

Figure 11:
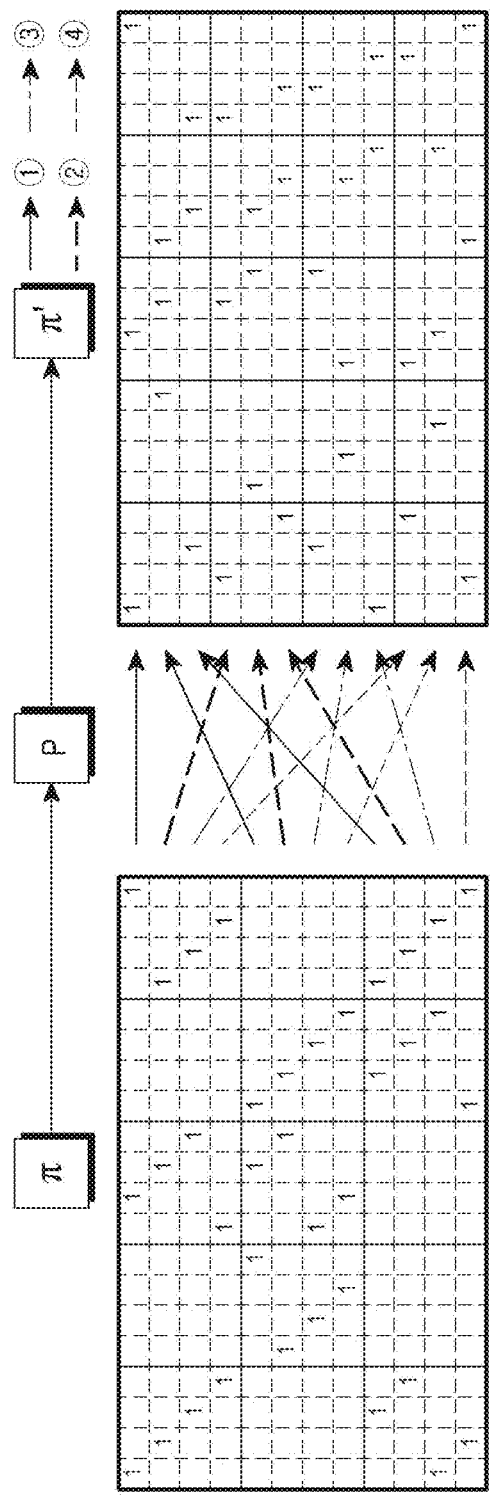
FIG. 11 schematically illustrates another example of a matrix structure of a double QC interleaver in a communication system supporting a BICM-ID scheme according to an embodiment of the present disclosure.

FIG. 11 schematically illustrates another example of a matrix structure of a double QC interleaver in a communication system supporting a BICM-ID scheme according to an embodiment of the present disclosure.

Referring to FIG. 11, where a row permutation operation is not applied, a double QC interleaver accesses a memory on a row element basis, and acquires information on the next row element using a right shift register. Alternatively, where the row permutation operation is applied, the double QC interleaver generates groups on a $m_Q$ rows basis, as shown in FIG. 11; thereby, the communication system acquires an advantage of a QC interleaver. As a result, the row permutation operation may improve performance of a decoder as well as performance of the double QC interleaver. A rule of a row permutation operation (row permutation rule) needs to be determined to allow the double QC interleaver to maintain a unique structure of a QC interleaver for applying the row permutation operation. This feature will be described below.

If $n_Q$ groups are generated by grouping rows included in a matrix $\Pi_c$ of a double QC interleaver on Q rows basis, an arbitrary group index among group indices from 1 to $n_Q$ is randomly allocated to each of the $n_Q$ groups. Here, the group index is information related to an order of selecting a group to which a row permutation operation is applied. The $n_Q$ group indices are defined as $\overline{G} = [G_1, G_2, \ldots, G_{n_Q}]$, and elements included in $\overline{G}$ i.e., the ith element among the nQ group indices is defined as $\overline{G}(i)$. The row permutation operation, i.e., a structured interleaver P may be expressed as Equation (6).

$$P: r \to \gamma \quad (6)$$

In Equation (6), r denotes a row index of the matrix $\Pi_c$, and $\gamma$ denotes a row index of a matrix $\Pi'$. As expressed in Equation (6), the row permutation operation is an operation of indicating that location of a row before interleaving corresponds to location of which row after the interleaving.

The row index of the matrix $\Pi_c$ will be described below. The row index r of the matrix $\Pi_c$ may be expressed such that a related sub-matrix is included in which group ($g_r$), or the related sub-matrix is included in which row index ($l_r$) within a related group. In this case, the row index r of the matrix $\Pi_c$ may be expressed as Equation (7).

$$r = q_r \times Q + l_r \qquad (7)$$

In Equation (7), gr may be expressed as Equation (8).

$$g_r = \left\lfloor \frac{r-1}{Q} \right\rfloor + 1 \qquad (8)$$

In Equation (7), lr may be expressed as Equation (9).

$$l_r = \mathrm{mod}(r-1, Q) + 1 \qquad (9)$$

In this case, the row permutation operation, i.e., P may be expressed as Equation (10).

$$\gamma = (j-1) \times Q + \overline{G}(i) \qquad (10)$$

Figure 12:
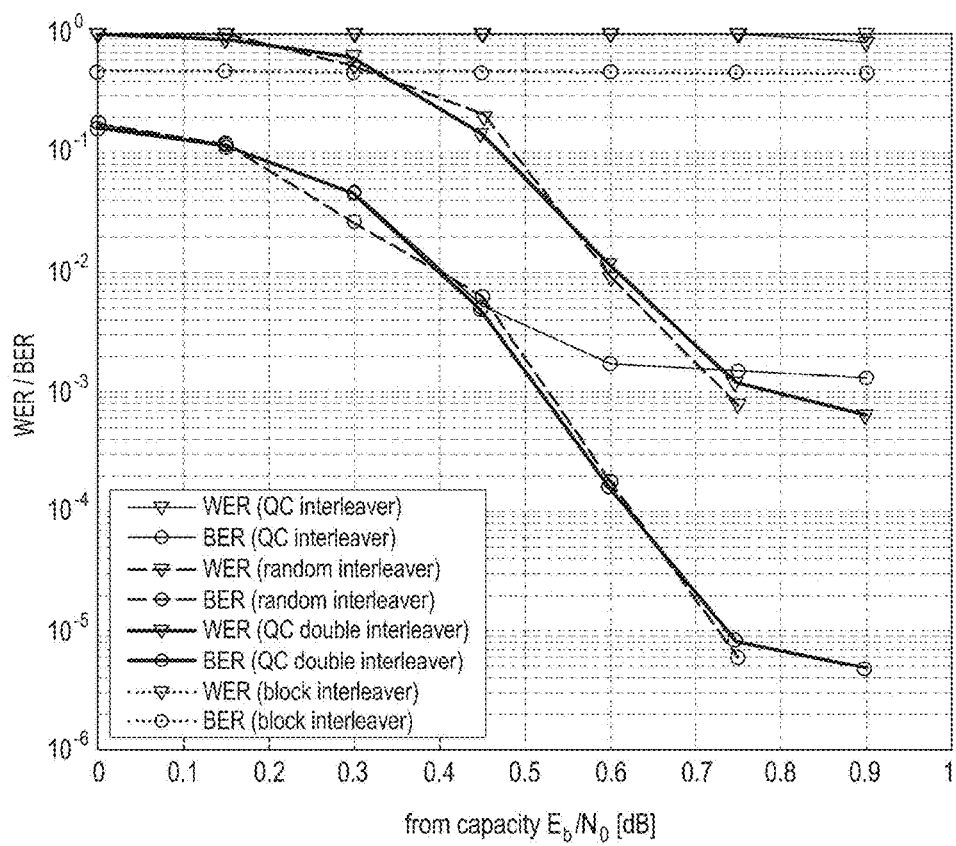
FIG. 12 schematically illustrates performance of a double QC interleaver in a communication system supporting a BICM-ID scheme according to an embodiment of the present disclosure.

FIG. 12 schematically illustrates performance of a double QC interleaver in a communication system supporting a BICM-ID scheme according to an embodiment of the present disclosure.

Referring to FIG. 12, performance of each of a conventional QC interleaver, a random interleaver, and a double QC interleaver is shown in FIG. 12. As shown in FIG. 12, it may be understood that the performance of the double QC interleaver proposed in an embodiment of the present disclosure is better than the performance of each of the conventional QC interleaver and the random interleaver in an aspect of a WER and an aspect of a BER.

Certain aspects of the present disclosure may also be embodied as computer readable code on a non-transitory computer readable recording medium. A non-transitory computer readable recording medium is any data storage device that can store data, which can be thereafter read by a computer system. Examples of the non-transitory computer readable recording medium include read only memory (ROM), random access memory (RAM), CD-ROMs, magnetic tapes, floppy disks, optical data storage devices, and carrier waves (such as data transmission through the Internet). The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

It can be appreciated that a method and apparatus according to an embodiment of the present disclosure may be implemented by hardware, software and/or a combination thereof. The software may be stored in a non-volatile storage, for example, an erasable or re-writable ROM, a memory, for example, a RAM, a memory chip, a memory device, or a memory integrated circuit (IC), or an optically or magnetically recordable non-transitory machine-readable (e.g., computer-readable), storage medium (e.g., a compact disc (CD), a digital versatile disc (DVD), a magnetic disk, a magnetic tape, and/or the like). A method and apparatus according to an embodiment of the present disclosure may be implemented by a computer or a mobile terminal that includes a controller and a memory, and the memory may be an example of a non-transitory machine-readable (e.g., computer-readable), storage medium suitable to store a program or programs including instructions for implementing various embodiments of the present disclosure.

The present disclosure may include a program including code for implementing the apparatus and method as defined by the appended claims, and a non-transitory machine-readable (e.g., computer-readable), storage medium storing the program. The program may be electronically transferred via any media, such as communication signals, which are transmitted through wired and/or wireless connections, and the present disclosure may include their equivalents.

An apparatus according to an embodiment of the present disclosure may receive the program from a program providing device which is connected to the apparatus via a wire or a wireless and store the program. The program providing device may include a memory for storing instructions which instruct to perform a content protect method which has been already installed, information necessary for the content protect method, and the like, a communication unit for performing a wired or a wireless communication with a graphic processing device, and a controller for transmitting a related program to a transmitting/receiving device based on a request of the graphic processing device or automatically transmitting the related program to the transmitting/receiving device.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for transmitting a signal in a signal transmitting apparatus in a communication system supporting a bit-interleaved coded modulation with iterative decoding (BICM-ID) scheme, the method comprising:
encoding an input message based on a preset outer encoding scheme to generate an outer code;
interleaving the outer code corresponding to an interleaving scheme based on a preset generation matrix to generate an interleaved signal;
encoding the interleaved signal based on a preset inner encoding scheme to generate an inner code;
modulating the inner code based on a preset modulation scheme to generate a modulated signal; and
transmitting the modulated signal,
wherein the preset generation matrix is generated by applying at least one of a preset column permutation rule and a preset row permutation rule to a generation matrix for a quasi-cyclic (QC) interleaver.

2. The method of claim 1, wherein the preset generation matrix is generated by interleaving columns included in the preset generation matrix for the QC interleaver based on the preset column permutation rule.

3. The method of claim 1, wherein the preset generation matrix is generated by interleaving rows included in the preset generation matrix for the QC interleaver based on the preset row permutation rule.

4. The method of claim 1, wherein the preset generation matrix is generated by interleaving columns included in the preset generation matrix for the QC interleaver based on the preset column permutation rule and by interleaving rows included in the preset generation matrix for the QC interleaver based on the preset row permutation rule.

5. The method of claim 1, wherein the preset modulation scheme is based on a frequency shift keying (FSK) scheme and a quadrature amplitude modulation (QAM) scheme.

6. The method of claim 1, wherein the outer encoding scheme and the inner encoding scheme are based on an irregular iterative code.

7. A method for receiving a signal in a receiving apparatus in a communication system supporting a bit-interleaved coded modulation with iterative decoding (BICM-ID) scheme, the method comprising:

demodulating a received signal based on a preset demodulation scheme to generate a demodulated signal;

decoding the demodulated signal based on an inner decoding scheme which corresponds to an inner encoding scheme which is used in a transmitting apparatus to generate extrinsic information;

deinterleaving the extrinsic information based on a deinterleaving scheme which corresponds to an interleaving scheme used in the signal transmitting apparatus to generate a priori information; and decoding the a priori information based on an outer decoding scheme which corresponds to an inner encoding scheme which is used in the transmitting apparatus to generate extrinsic information, wherein the interleaving scheme is based on a preset generation matrix, and wherein the preset generation matrix is generated by applying at least one of a preset column permutation rule and a preset row permutation rule to a generation matrix for a quasi-cyclic (QC) interleaver.

8. The method of claim 7, wherein the preset generation matrix is generated by interleaving columns included in the generation matrix for the QC interleaver based on the preset column permutation rule.

9. The method of claim 7, wherein the preset generation matrix is generated by interleaving rows included in the generation matrix for the QC interleaver based on the preset row permutation rule.

10. The method of claim 7, wherein the preset generation matrix is generated by interleaving columns included in the preset generation matrix for the QC interleaver based on the preset column permutation rule and by interleaving rows included in the preset generation matrix for the QC interleaver based on the preset row permutation rule.

11. The method of claim 7, wherein the modulation scheme is based on a frequency shift keying (FSK) scheme and a quadrature amplitude modulation (QAM) scheme.

12. The method of claim 7, wherein the outer decoding scheme and the inner encoding scheme are based on an irregular iterative code.

13. A signal transmitting apparatus in a communication system supporting a bit-interleaved coded modulation with iterative decoding (BICM-ID) scheme, the transmitting apparatus comprising:

an outer encoder configured to perform an outer encoding operation on an input message based on a preset outer encoding scheme to generate an outer code;

an interleaver configured to perform an interleaving operation on the outer code corresponding to an interleaving scheme which is based on a preset generation matrix to generate an interleaved signal;

an inner encoder configured to perform an inner encoding operation which is based on a preset inner encoding scheme on the interleaved signal to generate an inner code; and a mapper configured to perform a modulating operation on the inner code based on a preset modulation scheme to generate a modulated signal, and transmit the modulated signal, wherein the preset generation matrix is generated by applying at least one of a preset column permutation rule and a preset row permutation rule to a preset generation matrix for a quasi-cyclic (QC) interleaver.

14. The signal transmitting apparatus of claim 13, wherein the preset generation matrix is generated by interleaving columns included in the preset generation matrix for the QC interleaver based on the column permutation rule.

15. The signal transmitting apparatus of claim 13, wherein the preset generation matrix is generated by interleaving rows included in the preset generation matrix for the QC interleaver based on the row permutation rule.

16. The signal transmitting apparatus of claim 13, wherein the preset generation matrix is generated by interleaving columns included in the preset generation matrix for the QC interleaver based on the preset column permutation rule and by interleaving rows included in the preset generation matrix for the QC interleaver based on the preset row permutation rule.

17. The signal transmitting apparatus of claim 13, wherein the preset modulation scheme is based on a frequency shift keying (FSK) scheme and a quadrature amplitude modulation (QAM) scheme.

18. The signal transmitting apparatus of claim 13, wherein the outer encoding scheme and the inner encoding scheme are based on an irregular iterative code.

19. A signal receiving apparatus in a communication system supporting a bit-interleaved coded modulation with iterative decoding (BICM-ID) scheme, the signal receiving apparatus comprising:

a demapper configured to perform a demodulating operation on a received signal based on a preset demodulation scheme to generate a demodulated signal;

an inner decoder configured to perform an inner decoding operation on the demodulated signal based on an inner decoding scheme which corresponds to an inner encoding scheme which is used in a transmitting apparatus to generate extrinsic information;

a deinterleaver configured to perform a deinterleaving operation on the extrinsic information based on a deinterleaving scheme which corresponds to an interleaving scheme which is used in the signal transmitting apparatus to generate a priori information; and an outer decoder configured to perform an outer decoding operation on the a priori information based on an outer decoding scheme which corresponds to an inner encoding scheme which is used in the signal transmitting apparatus to generate extrinsic information, wherein the interleaving scheme is based on a preset generation matrix, and wherein the preset generation matrix is generated by applying at least one of a preset column permutation rule and a preset row permutation rule to a generation matrix for a quasi-cyclic (QC) interleaver.

20. The signal receiving apparatus of claim 19, wherein the preset generation matrix is generated by interleaving columns included in the preset generation matrix for the QC interleaver based on the preset column permutation rule.

21. The signal receiving apparatus of claim 19, wherein the preset generation matrix is generated by interleaving rows included in the preset generation matrix for the QC interleaver based on the preset row permutation rule.

22. The signal receiving apparatus of claim 19, wherein the preset generation matrix is generated by interleaving columns included in the preset generation matrix for the QC interleaver based on the preset column permutation rule and by interleaving rows included in the preset generation matrix for the QC interleaver based on the preset row permutation rule.

23. The signal receiving apparatus of claim 19, wherein the preset modulation scheme is based on a frequency shift keying (FSK) scheme and a quadrature amplitude modulation (QAM) scheme.

24. The signal receiving apparatus of claim 19, wherein the outer decoding scheme and the inner encoding scheme are based on an irregular iterative code.

\* \* \* \* \*